United States Patent
Forbes

(10) Patent No.: US 7,772,066 B2
(45) Date of Patent: Aug. 10, 2010

(54) DRAM TUNNELING ACCESS TRANSISTOR

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 12/255,186

(22) Filed: Oct. 21, 2008

(65) Prior Publication Data
US 2009/0046504 A1 Feb. 19, 2009

Related U.S. Application Data

(62) Division of application No. 11/219,085, filed on Sep. 1, 2005, now Pat. No. 7,446,372.

(51) Int. Cl.
*H01L 21/336* (2006.01)
(52) U.S. Cl. .................. 438/257; 438/156; 438/212; 257/328
(58) Field of Classification Search .......... 438/257, 438/156, 212; 257/296, 347, 328
See application file for complete search history.

(56) References Cited

U.S. PATENT DOCUMENTS

| | | | |
|---|---|---|---|
| 5,723,375 A | 3/1998 | Ma et al. | |
| 5,973,344 A | 10/1999 | Ma et al. | |
| 6,097,065 A | 8/2000 | Forbes et al. | |
| 6,104,061 A | 8/2000 | Forbes et al. | |
| 6,104,068 A | 8/2000 | Forbes | |
| 6,150,687 A | 11/2000 | Noble et al. | |
| 6,316,799 B1 | 11/2001 | Kunikiyo | |
| 6,320,222 B1 | 11/2001 | Forbes et al. | |
| 6,377,070 B1 | 4/2002 | Forbes | |
| 6,391,755 B2 | 5/2002 | Ma et al. | |
| 6,424,001 B1 | 7/2002 | Forbes et al. | |
| 6,448,601 B1 | 9/2002 | Forbes et al. | |
| 6,496,034 B2 | 12/2002 | Forbes et al. | |
| 6,531,727 B2 | 3/2003 | Ahn et al. | |
| 6,559,491 B2 | 5/2003 | Forbes et al. | |

(Continued)

OTHER PUBLICATIONS

J.P. Denton et al.; Fully Depleted Dual-Gated Thin-Film SOI P-MOSFET's Fabricated in SOI Islands with an Isolated Buried Polysilicon Backgate; Nov. 1996; IEEE Electron Device Letters, vol. 17 No. 11; pp. 509-511.

(Continued)

*Primary Examiner*—Ha Tran T Nguyen
*Assistant Examiner*—Shaun Campbell
(74) *Attorney, Agent, or Firm*—Leffert Jay & Polglaze, P.A.

(57) ABSTRACT

In one embodiment, a first transistor is comprised of a first p+ source region doped in an n-well in the substrate and a first n+ drain region doped on one side at the top of the pillar. A second transistor is comprised of a second p+ source region doped into the second side of the top of the pillar and serially coupled to the top drain region for the first transistor. A second n+ drain region is doped into the substrate adjacent the pillar. Ultra-thin body layer run along each pillar sidewall between their respective active regions. A gate structure is formed along the pillar sidewalls and over the body layers. The transistors operate by electron tunneling from the source valence band to the gate bias-induced n-type channels, along the ultra-thin silicon bodies, thus resulting in a drain current.

12 Claims, 9 Drawing Sheets

U.S. PATENT DOCUMENTS

| | | | |
|---|---|---|---|
| 6,566,682 | B2 | 5/2003 | Forbes |
| 6,664,589 | B2 | 12/2003 | Forbes et al. |
| 6,798,008 | B2 | 9/2004 | Choi |
| 6,861,684 | B2 | 3/2005 | Skotnicki et al. |
| 6,894,324 | B2 | 5/2005 | Ker et al. |
| 6,924,522 | B2 | 8/2005 | Ma et al. |
| 6,954,377 | B2 | 10/2005 | Choi et al. |
| 7,276,762 | B2 | 10/2007 | Forbes |
| 2002/0110032 | A1 | 8/2002 | Forbes |
| 2004/0032773 | A1* | 2/2004 | Forbes ................ 365/202 |

OTHER PUBLICATIONS

K. Shimomura et al.; A 1V 46ns 16Mb SOI-DRAM with body control technique; Nov. 1997; IEEE Journal of Solid-State Circuits; vol. 32 Issue 11; pp. 1712-1720; abstract.

X. Huant et al.; Sub-50n, P-Channel FinFET; May 2001; IEEE Transactions on Electron Devices; vol. 48, No. 5; pp. 880-886.

J. Kedzierski et al.; High-performance symmetric-gate and CMOS-compatible $V_t$ asymmetric-gate FinFET devices; 2001; IEEE; paper 19.5; 4pgs.

K. Kim et al.; Nanoscale CMOS Circuit Leakage Power Reduction by Double-Gate Device; 2004; International Symposium on Low Power Electronics and Design; pp. 102-107.

B.S. Doyle et al.; High performance fully-depleted tri-gate CMOS transistors; Apr. 2003; IEEE Electron Device Letters; vol. 24, No. 4; pp. 263-265; abstract.

B. Doyle et al.; Tri-Gate fully-depleted CMOS transistors: fabrication, design and layout; Jun. 2003; Symposium on VLSI Technology Digest of Technical Papers; pp. 133-134; abstract.

H. Takato et al.; High Performance CMOS Surrounding Gate Transistor (SGT) for Ultra High Density LSIs; 1988; IEEE Electron Devices Meeting, Technical Digest; pp. 222-225.

S. Miyano et al.; Numerical Analysis of a Cylindrical Thin-Pillar Transistor (CYNTHIA); Aug. 1992; IEEE Transactions on Electron Devices, vol. 39, No. 8; pp. 1876-1881.

Hon-Sum P. Wong et al.; Self-Aligned (Top and Bottom) Double-Gate MOSFET with a 25nm Thick Silicon Channel; 1997; IEEE International Electron Device Meeting; pp. 427-430.

Hyun-Jin Cho et al.; A Novel Pillar DRAM Cell for 4Gbot and Beyond; Jun. 1998; Digest of Technical Papers Symposium on VLSI Technology; pp. 38-39.

P. Xuan et al.; 60nm Planarized Ultra-thin Body Solid Phase Epitaxy MOSFETs; Jun. 2000; IEEE Device Research Conference; pp. 67-68.

Th. Nirschl et al.; The Tunneling Field Effect Transistor (TFET) as an Add-on for Ultra-Low-Voltage Analog and Digital Processes; Dec. 2004; IEEE International Electron Devices; IEDM Technical Digest 13-15; pp. 195-198.

A. Rahman et al.; Theory of Ballistic Nanotransistors; Sep. 2003; IEEE Transaction on Electron Devices; vol. 50, Issue 9; pp. 1853-1864.

* cited by examiner

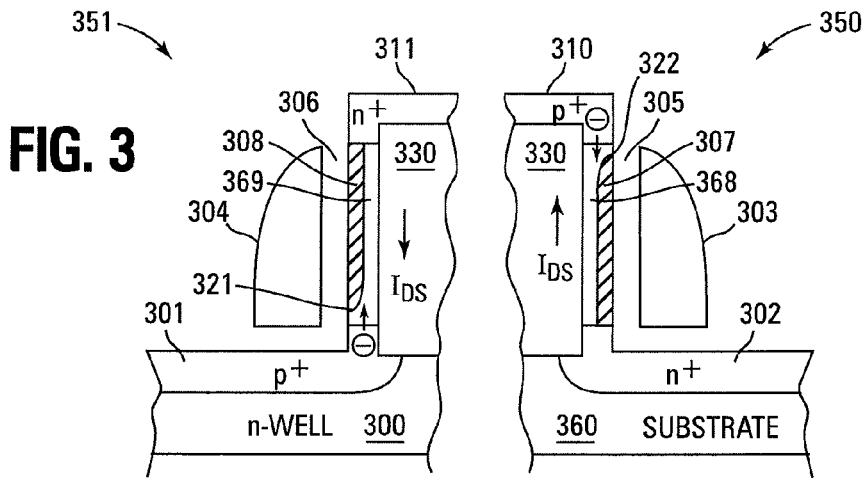
FIG. 3
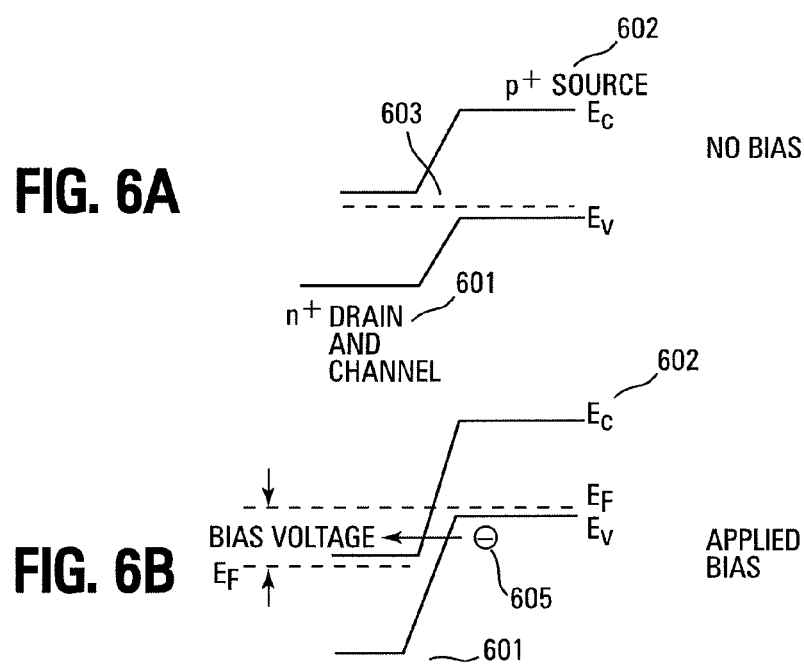
FIG. 6A
FIG. 6B
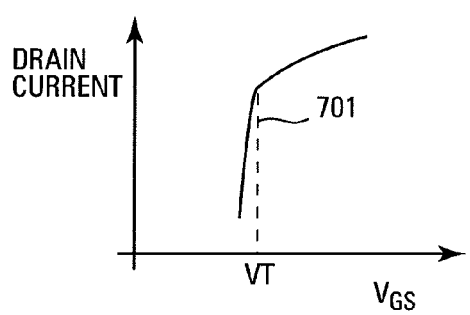
FIG. 7

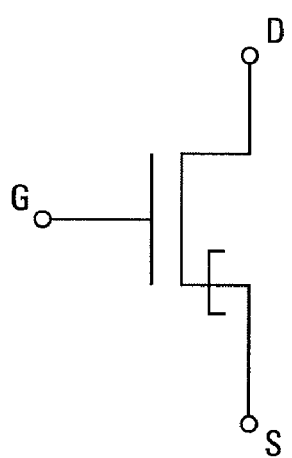 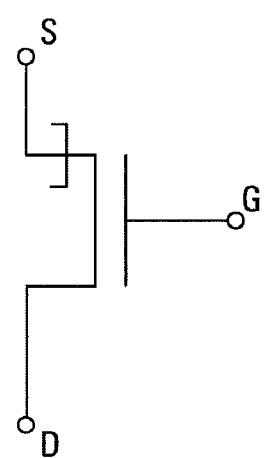
FIG. 4  FIG. 5

A-A'

DRAM TUNNELING ACCESS TRANSISTOR

RELATED APPLICATIONS

This Application is a Divisional of U.S. application Ser. No. 11/219,085, titled "DRAM TUNNELING ACCESS TRANSISTOR", filed Sep. 1, 2005, now U.S. Pat. No. 7,446, 372 (allowed) which is commonly assigned and incorporated herein by reference.

TECHNICAL FIELD OF THE INVENTION

The present invention relates generally to memory and in particular the present invention relates to dynamic random access memory.

BACKGROUND OF THE INVENTION

Transistor lengths have become so small that current continues to flow when they are turned off, draining batteries and affecting performance. When the gate-source voltage, $V_{gs}$, of a metal oxide semiconductor (MOS) transistor is less than its voltage threshold, $V_t$, it is in the sub-threshold region. This is characterized by a exponential change in drain current with $V_{gs}$. Sub-threshold leakage currents are difficult to control and reduce in conventional nano-scale planar complementary metal oxide semiconductor (CMOS) transistor technology. As technology scales, sub-threshold leakage currents can grow exponentially and become an increasingly large component of total power dissipation. This is of great concern to designers of handheld or portable devices where battery life is important, so minimizing power dissipation while achieving satisfactory performance is an increasingly important goal.

Two-dimensional short channel effects in a typical prior art planar transistor structure, shown in FIG. 1, result in a sub-threshold slope on the order of 120 mV/decade to 80 mV/decade. An ideal slope would be approximately 60 mV/decade, as shown in FIG. 2. The low power supply voltages used in nano-scale CMOS circuits that are now on the order of 2.5 V exacerbate the problem.

The planar transistor of FIG. 1 is comprised of a substrate 100 in which two source/drain regions 101, 102 are implanted. A control gate 103 is formed over the channel region 105 in which a channel forms during operation of the transistor.

Future supply voltages are projected to become even lower, in the range of 1.2 V, as designers try to improve battery life and performance of electronic devices. At such power levels, there will not be enough voltage range to turn on a transistor. A significant voltage overdrive above the threshold voltage is typically required to turn-on a prior art transistor and turn-off the transistor sub-threshold leakage. This can be several multiples of the 100 mV/decade threshold voltage slope illustrated in FIG. 2. For good $I_{on}/I_{off}$ ratios, the sub-threshold leakage current needs to be at least eight orders of magnitude or eight decades below the transistor current levels when the transistor is turned on. With a 1.2 V voltage range, there will not be enough voltage swing to allow both objectives: high on current and low sub-threshold leakage to be accomplished with conventional planar devices.

Gate body connected transistors as previously described in CMOS circuits provide a dynamic or changing threshold voltage, low when the transistor is on and a high threshold when it is off. Another alternative is using dual gated transistors. Yet another alternative is surrounding gate structures where the gate completely surrounds the transistor channel. This allows best control over the transistor channel but the structure has been difficult to realize in practice. Another technique has been to re-crystallize amorphous silicon that passes through a horizontal or vertical hole. None of these techniques, however, can have a sub-threshold slope less than the ideal characteristic of 60 mV/decade for a convention MOSFET.

For the reasons stated above, and for other reasons stated below that will become apparent to those skilled in the art upon reading and understanding the present specification, there is a need in the art for a device structure that has reduced sub-threshold leakage.

BRIEF DESCRIPTION OF THE DRAWINGS

FIG. 3 shows a schematic cross-sectional view of two ultra-thin silicon body tunneling transistors of the present invention.

FIG. 4 shows a circuit symbol in accordance with a first of the tunneling transistors of the embodiment of FIG. 3.

FIG. 5 shows a circuit symbol in accordance with a second of the tunneling transistors of the embodiment of FIG. 3.

FIGS. 6A and 6B show energy band diagrams of the electrical operation of the tunneling transistor embodiment of FIG. 3.

FIG. 7 shows a plot of the sub-threshold leakage current of the tunneling transistor embodiment of FIG. 3.

DETAILED DESCRIPTION

Figure 1:
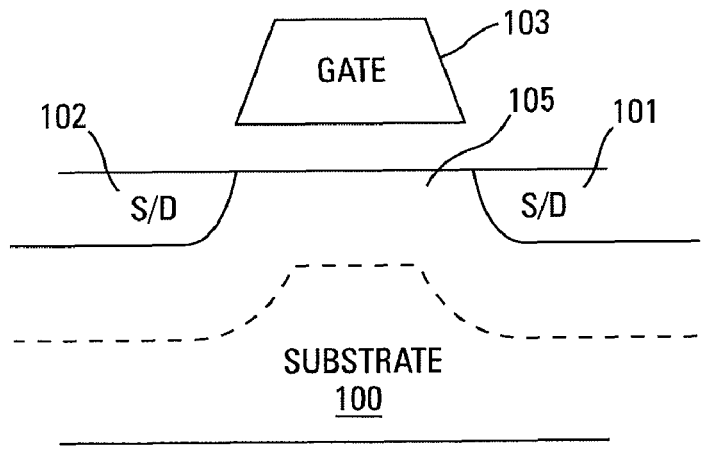
FIG. 1 shows a cross-sectional view of a typical prior art planar CMOS transistor structure.
Figure 2:
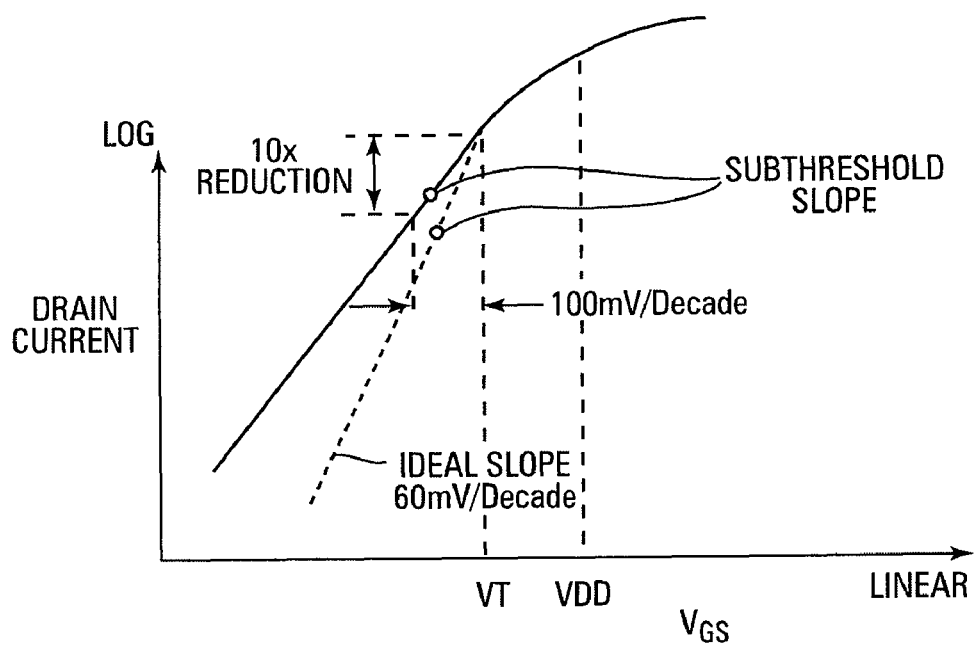
FIG. 2 shows a graphical plot of sub-threshold leakage current for a typical prior art CMOS transistor as compared to an ideal sub-threshold leakage characteristic.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

FIG. 3 illustrates schematic cross-sectional view of one embodiment for two ultra-thin silicon body, tunneling NMOS transistors 350, 351 of the present invention. For purposes of clarity, FIG. 3 shows the two transistors 350, 351 as being separated. However, as is shown and discussed subsequently, the transistors 350, 351 are formed around the same oxide pillar 330. In fact, the drain 311 of the first transistor is series connected to the source 310 of the second transistor over the oxide pillar 330.

The illustrated embodiment is formed in a p-type silicon substrate 360 and a doped n-well 300 in the substrate 360. Alternate embodiments may use other conductivity doping for the substrate/well and/or other materials for the substrate instead of silicon.

Instead of the conventional n+ source region formed in the n-well 300, the source 301 of the left most transistor 351 is p+ doped. Additionally, the source wiring that couples the source to other components in a circuit is also p+ doped. The drain 302 of the right transistor 350 is an n+ region doped in the substrate 360.

An oxide pillar 330 is formed over the n-well 300 and substrate 360. Ultra-thin, lightly doped, p-type body layers 368, 369 are formed along the sides of the oxide pillar 330. In one embodiment, the dual transistors are implemented in 0.1 micron technology such that the transistor has a height of approximately 100 nm and a thickness in the range of 25 to 50 nm. The p-type body layers 368, 369 have a thickness in the range of 5 to 20 nm. Alternate embodiments may use other dimensions. Alternate embodiments can have other heights and/or thickness ranges.

The left transistor 351 has an n+ doped drain region 311 formed at the top of the left silicon body 369 and oxide pillar 330. The right transistor 350 has a p+ doped source region 310 formed at the top of the right silicon body 368 and oxide pillar 330.

A gate insulator layer 305, 306 is formed over each ultra-thin silicon body 368, 369. The insulator can be an oxide or some other type of dielectric material.

A gate structure 303, 304 is formed over each insulator layer 305, 306. In one embodiment, the gate is comprised of polysilicon. As is well known in the art, proper biasing of the gates 303, 304 induce an n-channel 307, 308 to form in a channel region between their respective source 310, 301 and drain 302, 311 regions.

The electrical operation of the transistors is based on a MOS-gated pin-diode. During operation of the embodiment illustrated in FIG. 3, the gates 304, 303 are biased to induce n-type channels 321, 322 to form in the ultra-thin bodies 369, 368. A drain 311 bias causes tunneling to occur from the source 301 valence band to the n-channel 321 resulting in a drain current in the left transistor. The drain-to-source current ($I_{DS}$) of the left transistor 351 flows from the top drain region 311 to the bottom source region 301. $I_{DS}$ of the right transistor 350 flows from the bottom drain region 302 to the top source region 310.

FIGS. 4 and 5 illustrate circuit diagram symbols of the ultra-thin body, tunneling transistors of the embodiment of FIG. 3. FIG. 4 illustrates the left transistor 351 of FIG. 3. FIG. 5 illustrates the right transistor 350 of FIG. 3.

FIGS. 6A and 6B illustrate energy band diagrams of the operation of the transistor of FIG. 3. The upper line of each figure indicating the energy of the conduction band and the lower line indicating the energy of the valence band. FIG. 6A illustrates a no bias condition for the transistor. The diagram shows the channel and n+ drain 601 and p+ source 602. In the non-conducting condition, a large barrier 603 exists between the drain 601 and source 602 regions.

FIG. 6B illustrates that applying a bias to the gate creates a conducting condition in which an electron channel is induced to form where the electron concentration is degenerated. A tunnel junction 605 is formed at the source side 602 of the channel.

Applying a drain bias causes band bending and the n-type region conduction band to be below the valence band edge in the source region. Electrons can then tunnel from the source to the n-channel regions. Since there can be no tunneling until the conduction band edge in the channel is drawn below the valence band in the source, the turn-on characteristic is very sharp and the sub-threshold slope approaches the ideal value for a tunneling transistor of zero mV/decade as illustrated in FIG. 7.

FIG. 7 illustrates a plot of drain current versus the gate-to-source voltage ($V_{GS}$) of the transistor. This plot shows the very steep sub-threshold slope "S" 701 that results from the biasing of the embodiments of the ultra-thin body transistor of the present invention. The vertical, drain current axis of FIG. 7 is a log scale while the horizontal, $V_{GS}$ axis is linear.

Figure 8:
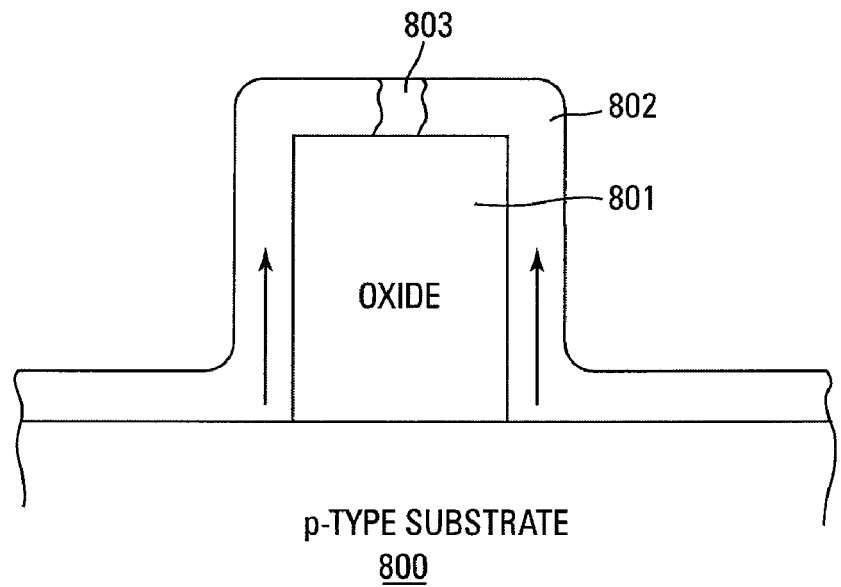
FIG. 8 shows fabrication process steps in accordance with the two ultra-thin silicon body tunneling transistors of the present invention.

FIG. 8 illustrates one embodiment of a method for fabricating the vertical tunneling, ultra-thin silicon body transistors of the present invention. In this embodiment, oxide pillars 801 are formed by an etch process on the surface of a substrate 800. In one embodiment, the substrate/well 800 is a p-type silicon. Amorphous silicon 802 is re-crystallized over the substrate 800 surface and oxide pillars 801. This can be accomplished by solid phase epitaxial growth.

Since crystal growth can occur over short distances, the top of the pillar 801 can have grain boundaries 803 in the polycrystalline silicon 802. As is well known in the art, a grain boundary is the boundary between grains in polycrystalline material. It is a discontinuity of the material structure having an effect on its fundamental properties.

Figure 9:
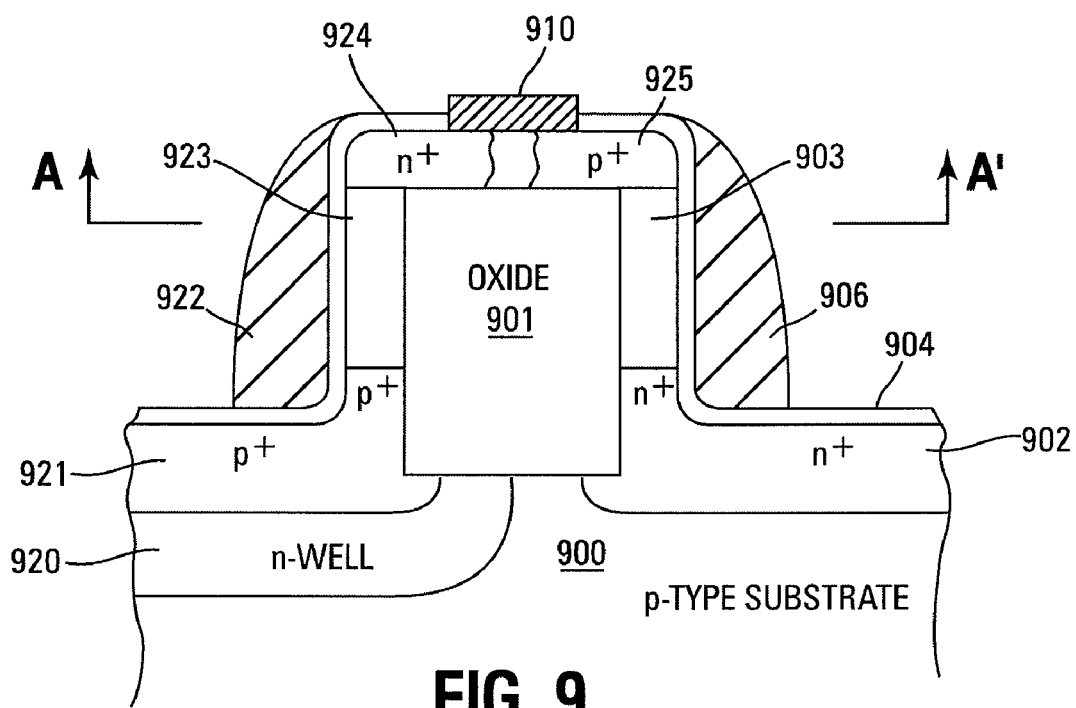
FIG. 9 shows additional fabrication process steps in accordance with the two ultra-thin silicon body tunneling transistors of the present invention.

FIG. 9 illustrates further fabrication steps for the transistor embodiments of the present invention. The sidewalls of the pillar 901 are the ultra-thin bodies 903, 923 that are lightly doped p-type silicon. The wafers are masked and the n-wells are implanted. The p-type regions 921, 925 are implanted without using a mask. The pillars are masked and the unmasked drain regions 924 and 902 are implanted n+. Since the p+ doping is always lower than the n+, the n+ regions can be implanted over the p+ regions and they will be n+.

A gate insulator layer 904 is grown or deposited over the silicon layers 903, 923. In one embodiment, the gate insulator layer 904 is an oxide. The gates 906, 922 are formed over the insulator 904. In one embodiment, the gates 906, 922 are formed by a sidewall etch technique. A data capacitor contact 910 is added to the top of the pillar 901 to enable connection of the series connect node between the drain 924 of the first transistor and the source 925 of the second transistor. A cross-section along axis A-A' of FIG. 9 is illustrated in FIG. 10 to show the structure of the transistors of the present invention.

Figure 10:
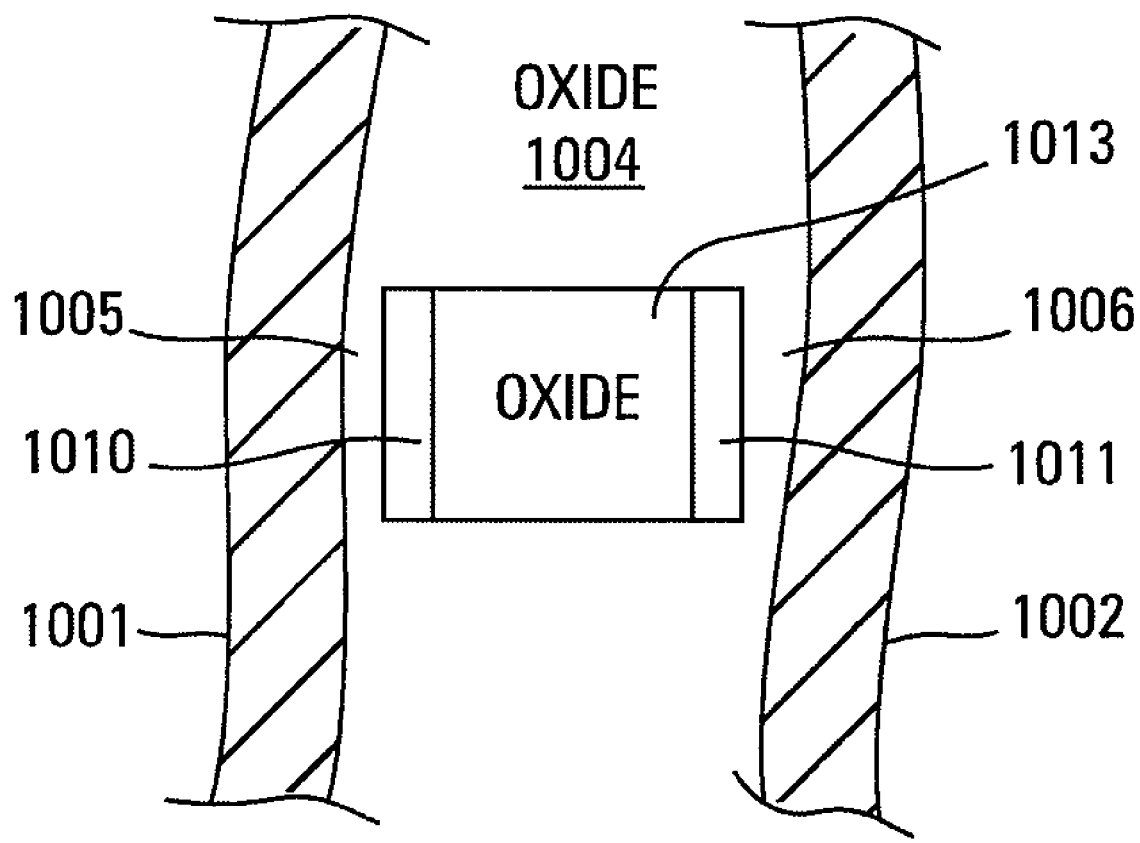
FIG. 10 shows a top cross-section view of one embodiment of the two ultra-thin silicon body tunneling transistors of the present invention along axis A-A' of FIG. 9.

FIG. 10 illustrates a top view of cross-section A-A' of FIG. 9 of a dual gated embodiment of the two vertical tunneling, ultra-thin body transistors of the present invention. This view shows the two gates 1001, 1002 formed around the deposited oxide 1004 and as a gate insulator 1005, 1006. Deposited oxide 1004 also separates adjacent transistor pillars. The ultra-thin bodies 1010, 1011 are located on either side of the oxide pillar 1013.

Figure 11:
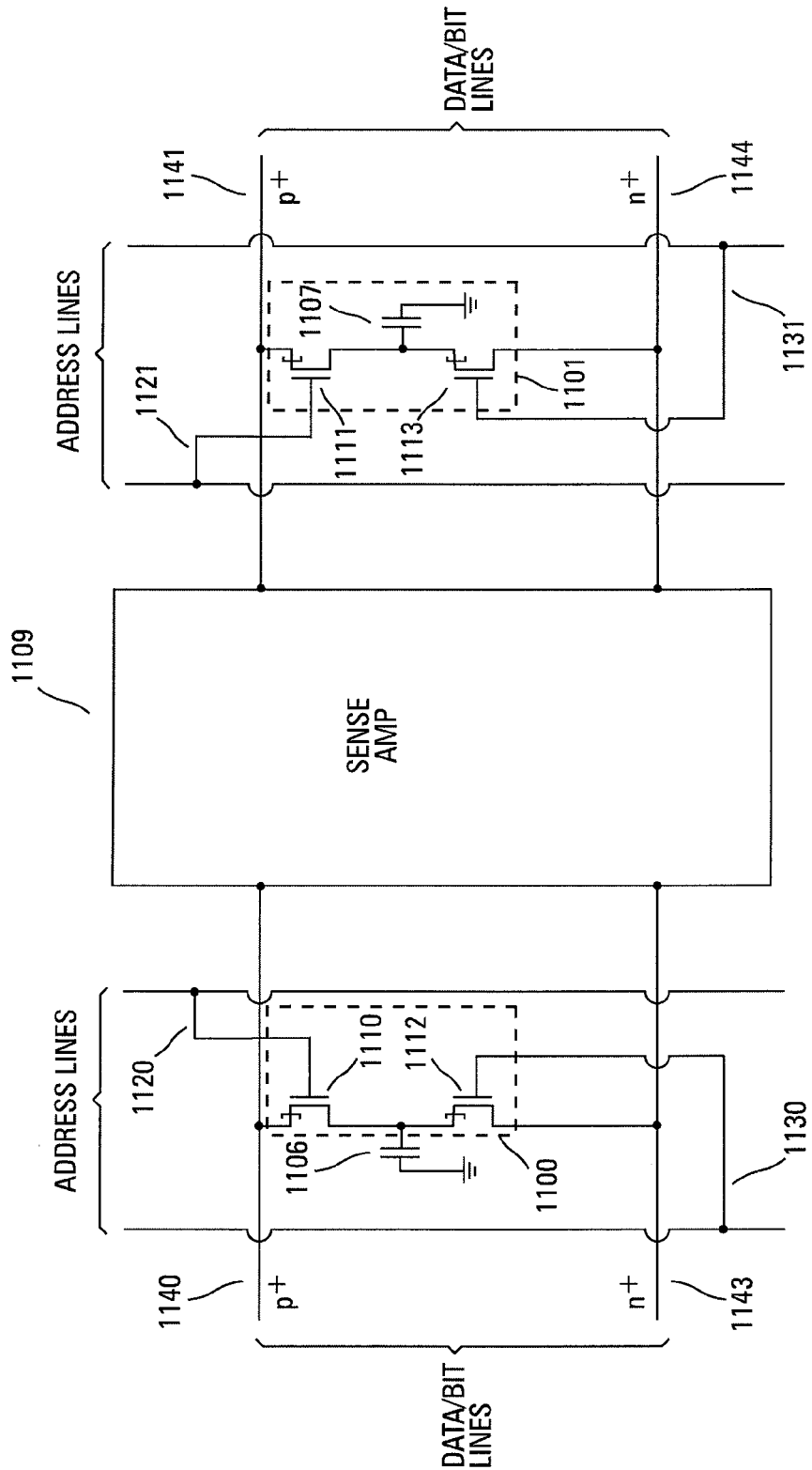
FIG. 11 shows a schematic diagram of one application of the embodiments of the ultra-thin silicon body tunneling transistors of the present invention as DRAM access transistors.

FIG. 11 illustrates one embodiment of an application of the vertical tunneling, ultra-thin body transistors as DRAM access transistors. This figure shows a DRAM cell circuit 1150 using the transistors of the present invention to control the coupling of the DRAM data capacitors 1106, 1107 to the sense amplifier 1109.

This figure shows two sets 1100, 1101 of transistors as described previously. The read address 1120, 1121 and read data bit lines 1140, 1141 are separate and apart from the write address lines 1130, 1131 and write data bit lines 1143, 1144. This is necessary as the tunneling NMOS transistors 1100, 1101 of the present invention are not symmetrical like conventional prior art NMOS transistors. The tunneling transistors 1100, 1101 conduct current in only one direction, into the n+ drain and out of the p+ source. The NMOS transistor on one side of the pillar 1110, 1111 reads data while the NMOS transistor on the other side of the pillar 1112, 1113 writes data into the storage capacitor 1106, 1107. The sense amplifier 1109 senses the current on the data/bit lines to determine the state of the data capacitor 1106, 1107.

Figure 12:
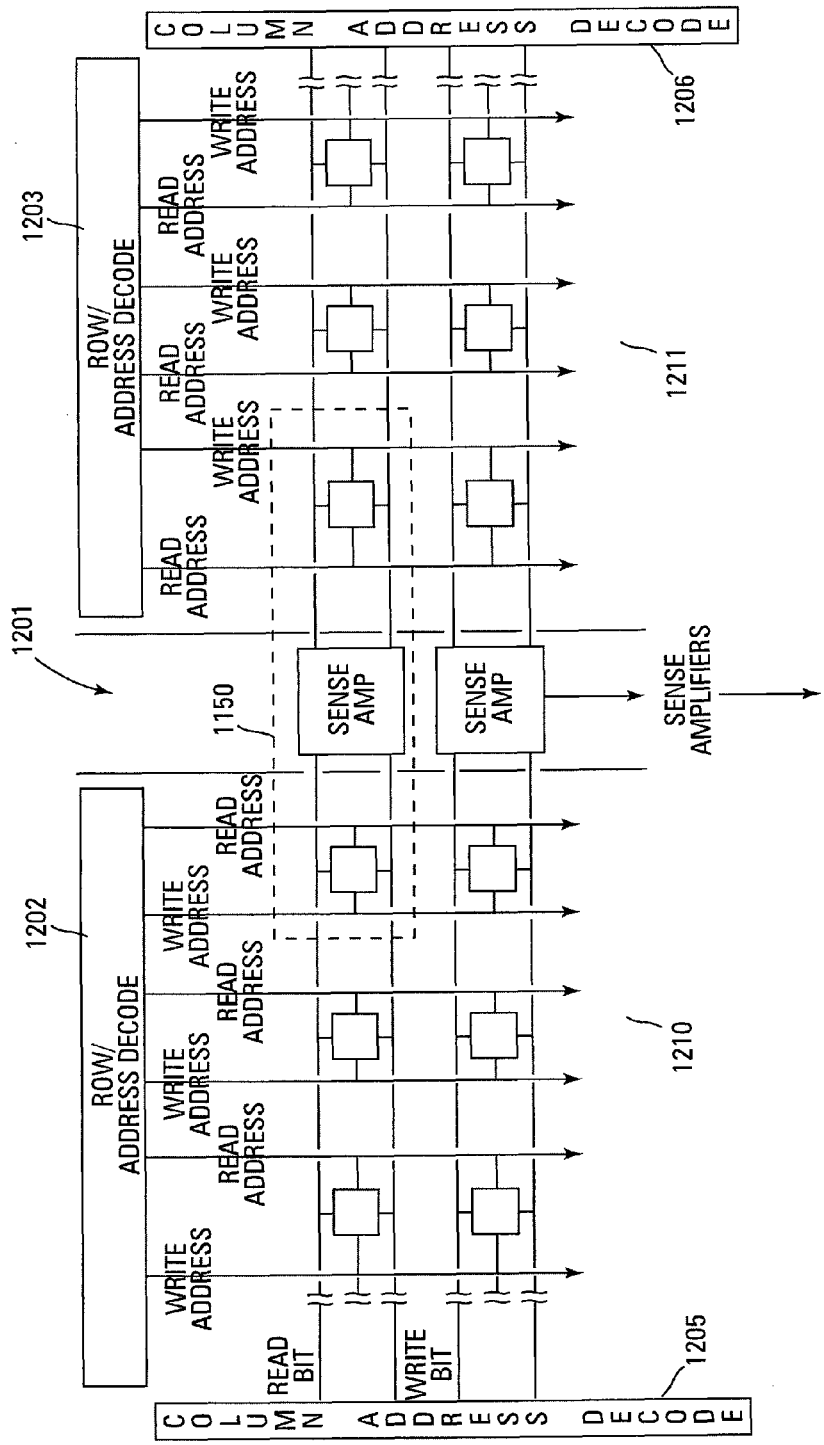
FIG. 12 shows a schematic diagram of an open bit DRAM array structure application using the ultra-thin silicon body tunneling transistors of the present invention.

FIG. 12 illustrates another embodiment of an application of the vertical tunneling ultra-thin body transistors as DRAM access transistors in accordance with the embodiment of FIG. 11. This figure shows how the circuit 1150 of FIG. 11 fits in an open bit line DRAM array with separate write address and read address lines as well as separate read data/bit and write data/bit lines.

The embodiment of FIG. 12 is comprised of memory cell arrays 1210, 1211 that are each coupled to a row address decode circuit 1202, 1203 and a column address decode circuit 1205, 1206. The column of sense amplifiers 1201 senses the state of each row of DRAM cells.

Figure 13:
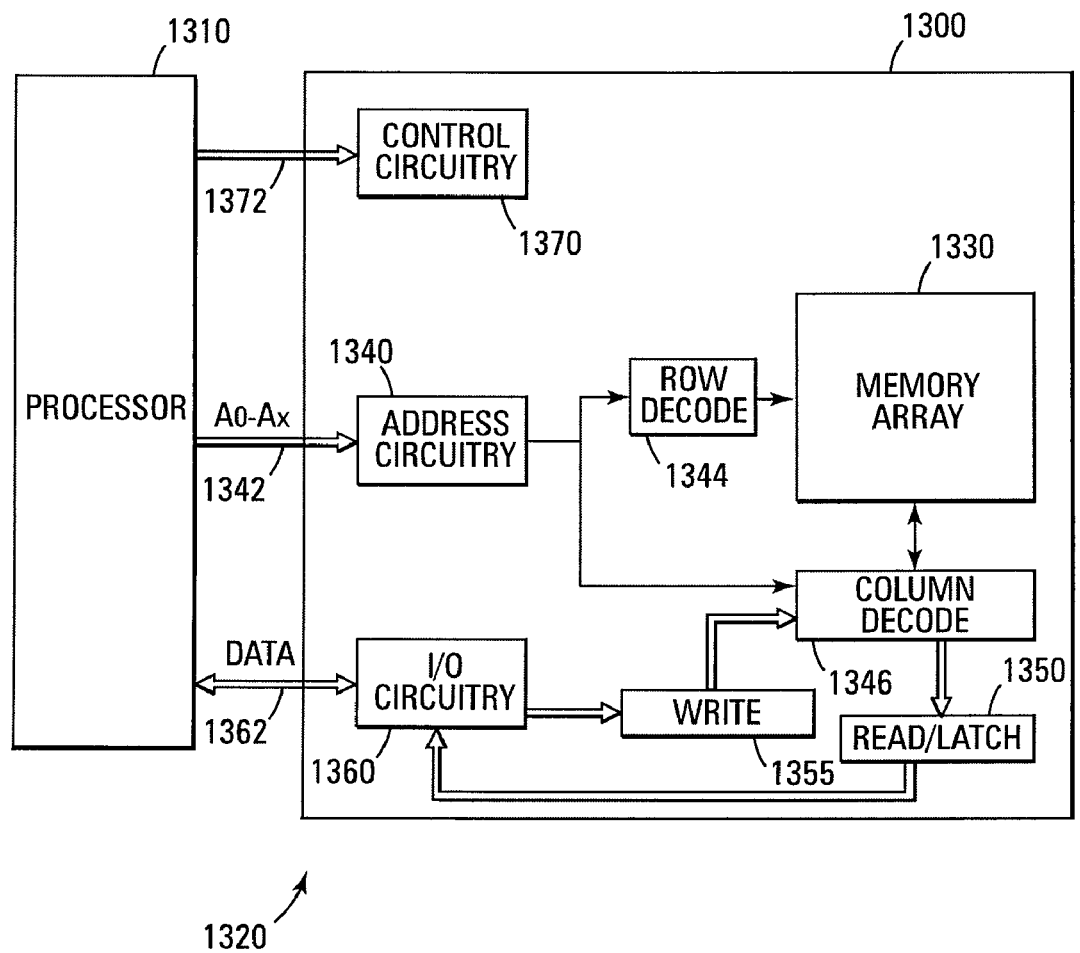
FIG. 13 shows a block diagram of one embodiment of a memory device incorporating the embodiments of the vertical tunneling, ultra-thin body transistor of the present invention.

FIG. 13 illustrates a functional block diagram of a memory device 1300 of one embodiment of the present invention. The memory device 1300 is another embodiment of a circuit that can include the ultra-thin body access transistors of the present invention.

The memory device includes an array of memory cells 1330 such as DRAM type memory cells or non-volatile memory cells. The memory array 1330 is arranged in banks of rows and columns along word lines and bit lines, respectively.

An address buffer circuit 1340 is provided to latch address signals provided on address input connections A0-Ax 1342. Address signals are received and decoded by a row decoder 1344 and a column decoder 1346 to access the memory array 1330. It will be appreciated by those skilled in the art, with the benefit of the present description, that the number of address input connections depends on the density and architecture of the memory array 1330. That is, the number of addresses increases with both increased memory cell counts and increased bank and block counts.

The memory device 1300 reads data in the memory array 1330 by sensing voltage or current changes in the memory array columns using sense/latch circuitry 1350. The sense/latch circuitry, in one embodiment, is coupled to read and latch a row of data from the memory array 1330. Data input and output buffer circuitry 1360 is included for bi-directional data communication over a plurality of data connections 1362 with the controller 1310). Write circuitry 1355 is provided to write data to the memory array.

Control circuitry 1370 decodes signals provided on control connections 1372 from the processor 1310. These signals are used to control the operations on the memory array 1330, including data read, data write, and erase operations. The control circuitry 1370 may be a state machine, a sequencer, or some other type of controller.

The memory device illustrated in FIG. 13 has been simplified to facilitate a basic understanding of the features of the memory. A more detailed understanding of internal circuitry and functions of DRAM's and/or flash memories are known to those skilled in the art.

The vertical tunneling, ultra-thin body transistors of the present invention can be used in the memory device of FIG. 13, as well as the subsequently discussed memory module, as select transistors, control transistors, and in logic elements such as NAND and NOR gates.

Figure 14:
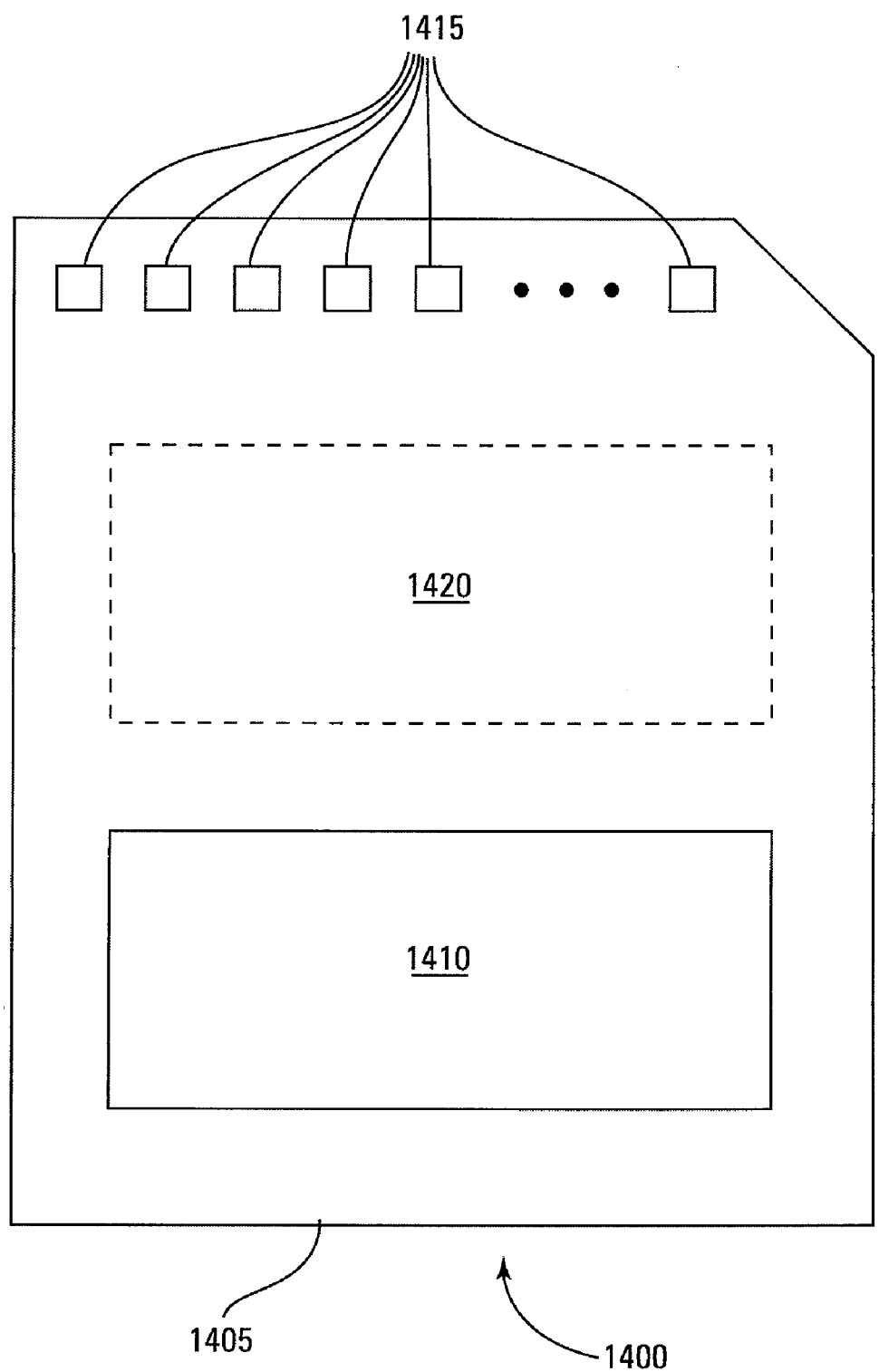
FIG. 14 shows a block diagram of one embodiment of a memory module incorporating the embodiments of the vertical tunneling, ultra-thin body transistor of the present invention.

FIG. 14 is an illustration of an exemplary memory module 1400. Memory module 1400 is illustrated as a memory card, although the concepts discussed with reference to memory module 1400 are applicable to other types of removable or portable memory, e.g., USB flash drives, and are intended to be within the scope of "memory module" as used herein. In addition, although one example form factor is depicted in FIG. 14, these concepts are applicable to other form factors as well.

In some embodiments, memory module 1400 will include a housing 1405 (as depicted) to enclose one or more memory devices 1410, though such a housing is not essential to all devices or device applications. At least one memory device 1410 is a non-volatile memory [including or adapted to perform elements of the invention]. Where present, the housing 1405 includes one or more contacts 1415 for communication with a host device. Examples of host devices include digital cameras, digital recording and playback devices, PDAs, personal computers, memory card readers, interface hubs and the like. For some embodiments, the contacts 1415 are in the form of a standardized interface. For example, with a USB flash drive, the contacts 1415 might be in the form of a USB Type-A male connector. For some embodiments, the contacts 1415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 1415 provide an interface for passing control, address and/or data signals between the memory module 1400 and a host having compatible receptors for the contacts 1415.

The memory module 1400 may optionally include additional circuitry 1420 which may be one or more integrated circuits and/or discrete components. For some embodiments, the additional circuitry 1420 may include a memory controller for controlling access across multiple memory devices 1410 and/or for providing a translation layer between an external host and a memory device 1410. For example, there may not be a one-to-one correspondence between the number of contacts 1415 and a number of I/O connections to the one or more memory devices 1410. Thus, a memory controller could selectively couple an I/O connection (not shown in FIG. 14) of a memory device 1410 to receive the appropriate signal at the appropriate I/O connection at the appropriate time or to provide the appropriate signal at the appropriate contact 1415 at the appropriate time. Similarly, the communication protocol between a host and the memory module 1400 may be different than what is required for access of a memory device 1410. A memory controller could then translate the command sequences received from a host into the appropriate command sequences to achieve the desired access to the memory device 1410. Such translation may further include changes in signal voltage levels in addition to command sequences.

The additional circuitry 1420 may further include functionality unrelated to control of a memory device 1410 such as logic functions as might be performed by an ASIC (application specific integrated circuit). Also, the additional circuitry 1420 may include circuitry to restrict read or write access to the memory module 1400, such as password protection, biometrics or the like. The additional circuitry 1420 may include circuitry to indicate a status of the memory module 1400. For example, the additional circuitry 1420 may include functionality to determine whether power is being supplied to the memory module 1400 and whether the memory module 1400 is currently being accessed, and to display an indication of its status, such as a solid light while powered and a flashing light while being accessed. The additional circuitry 1420 may further include passive devices, such as decoupling capacitors to help regulate power requirements within the memory module 1400.

CONCLUSION

In summary, a vertical tunneling, ultra-thin body transistor NMOS FET has a p+ source, rather than an n+ source as in prior art transistors. In this configuration, electrons tunnel from the p+ source to induced n-channels along the ultra-thin body sidewalls of an oxide pillar. Such a configuration provides an ideal sub-threshold slope that is substantially close to 0 mV/decade and thus obtain low sub-threshold leakage current in CMOS circuits. The substantially reduced leakage current reduces the power requirements for electronic circuits.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for fabricating a pair of vertical tunneling, ultra-thin body transistors on a substrate, the method comprising:
    forming an oxide pillar on the substrate surface;
    forming an amorphous silicon layer over the substrate surface and the pillar such that the amorphous silicon layer, on opposing sides of the pillar, forms ultra-thin silicon bodies;
    doping a p+ region into the substrate on a first side of the pillar and a first portion of the amorphous silicon layer on top of a second side of the pillar;
    doping an n+ region into a second portion of the amorphous silicon layer on top of the first side of the pillar and a region of the substrate on the second side of the pillar;
    forming an n-well in the substrate on the first side of the pillar such that the p+ region in the substrate resides in the n-well and the n+ region on the second side of the pillar does not reside in the n-well;
    forming a gate insulator over the amorphous silicon layer; and
    forming a gate structure over the gate insulator on each side of the pillar.

2. The method of claim 1 wherein the doping is performed by ion implantation.

3. The method of claim 1 wherein the amorphous silicon layer is formed by regrowth of crystalline silicon along sidewalls of the oxide pillar by solid phase epitaxial growth.

4. The method of claim 1 wherein forming the gate structure comprises forming a polysilicon gate.

5. The method of claim 1 wherein doping the p+ regions includes creating p+ source regions in the substrate n-well for a first transistor of the pair and the top of the pillar for the second transistor such that vertical tunneling from the source regions through their respective silicon bodies occurs in response to biasing of the gate structures and the n+ regions.

6. A method for fabricating a pair of vertical tunneling access transistors with a DRAM cell in a substrate, the method comprising:
    forming an oxide pillar on the substrate surface;
    forming an amorphous silicon layer over the surface and the pillar forming ultra-thin silicon bodies along sidewalls of the pillar;
    doping portions of the amorphous silicon layer on the top of the pillar to form an n+ drain region and a p+ source region coupled together serially at a node;
    doping portions of the amorphous silicon layer adjacent to the pillars and the substrate to form an n-well in the substrate, a p+ source region in the n-well, and an n+ drain region in the substrate;
    forming an insulator layer over each silicon body to act as a gate insulator; and
    forming separate gate structures on opposing sides of the pillar over the silicon bodies; and
    forming a capacitor coupled to the node.

7. The method of claim 6 wherein at least one of the silicon bodies is formed to a thickness in a range of 5-20 nm, the pair of transistors is formed to a height of 100 nm and a thickness in a range of 25-50 nm.

8. The method of claim 6 wherein the gate structure is formed from polysilicon.

9. The method of claim 6 wherein the pillar is formed to a height of 100 nm.

10. The method of claim 6 wherein the gate insulator is comprised of an oxide.

11. The method of claim 6 and further including forming p+ wires into the substrate n-well and coupled to the p+ source region.

12. The method of claim 6 wherein the gate insulator is either grown or deposited.

* * * * *

UNITED STATES PATENT AND TRADEMARK OFFICE
CERTIFICATE OF CORRECTION

| | | |
|---|---|---|
| PATENT NO. | : 7,772,066 B2 | Page 1 of 1 |
| APPLICATION NO. | : 12/255186 | |
| DATED | : August 10, 2010 | |
| INVENTOR(S) | : Leonard Forbes | |

It is certified that error appears in the above-identified patent and that said Letters Patent is hereby corrected as shown below:

On the Title Page Item (56), under "U.S. Patent Documents", line 6, delete "Ahn et al." and insert -- Forbes et al. --, therefor.

In column 1, lines 7-8, after "7,446,372" delete "(allowed)" and insert -- , --, therefor.

Signed and Sealed this

Nineteenth Day of October, 2010

David J. Kappos
*Director of the United States Patent and Trademark Office*